United States Patent

Ishii et al.

[11] 4,012,108
[45] Mar. 15, 1977

[54] HOLOGRAM MEMORY APPARATUS

[75] Inventors: Akira Ishii, Kawasaki; Keiichi Ueno, Tokyo, both of Japan

[73] Assignee: Nippon Telegraph and Telephone Public Corporation, Tokyo, Japan

[22] Filed: Jan. 15, 1975

[21] Appl. No.: 541,303

[30] Foreign Application Priority Data

Jan. 17, 1974    Japan ................... 49-7509

[52] U.S. Cl. .................... 350/3.5; 340/173 LM
[51] Int. Cl.² ................. G03H 1/30; G03H 1/16
[58] Field of Search ............. 350/3.5; 358/2; 178/6.5, 6.7 R; 340/173 LT, 173 LM

[56] References Cited
UNITED STATES PATENTS

| | | | |
|---|---|---|---|
| 3,657,473 | 4/1972 | Corcoran | 350/3.5 |
| 3,698,794 | 10/1972 | Alphonse | 350/3.5 |
| 3,779,625 | 12/1973 | Lang | 350/3.5 |
| 3,812,496 | 5/1974 | Brooks | 350/3.5 |

*Primary Examiner*—Ronald J. Stern
*Attorney, Agent, or Firm*—Sughrue, Rothwell, Mion, Zinn & Macpeak

[57] ABSTRACT

A hologram memory apparatus in which the information is displayed as one-dimensional spatial pattern and recorded in a form of strip-shaped one-dimensional hologram having sharpness in counter proportion to the width of the light flux and the information is read by a one-dimensional photo detector array. The apparatus comprises an optical system for writing in the information having a common optical axis for the input information signal light and for the reference light. The apparatus can record either analog information or digital information by a single apparatus.

14 Claims, 18 Drawing Figures

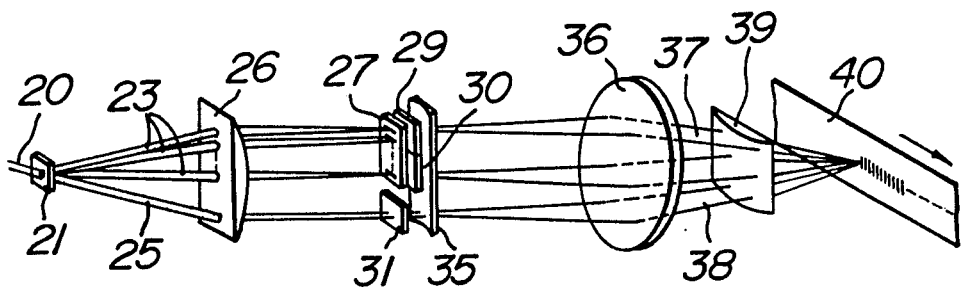
FIG_1
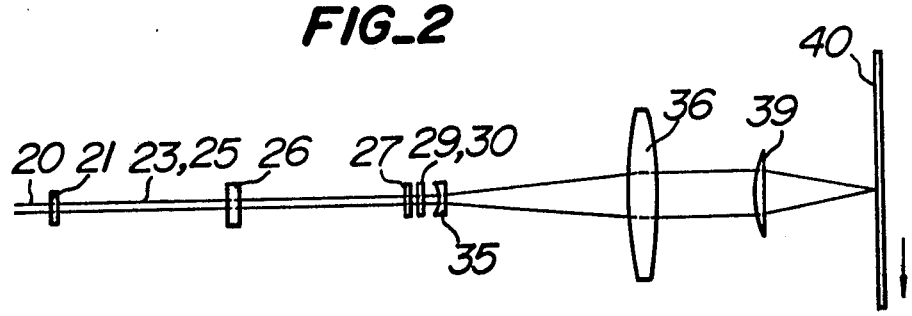
FIG_2
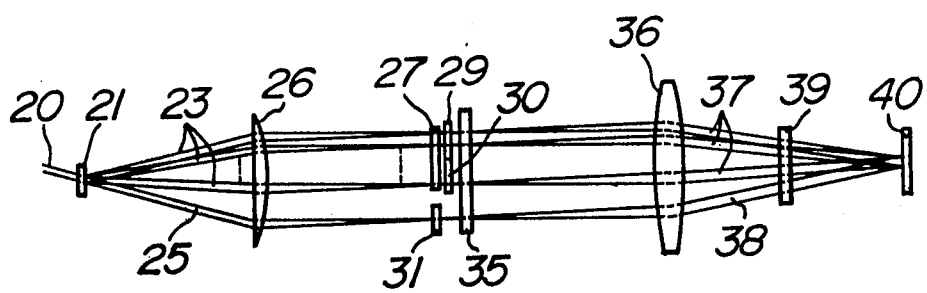
FIG_3

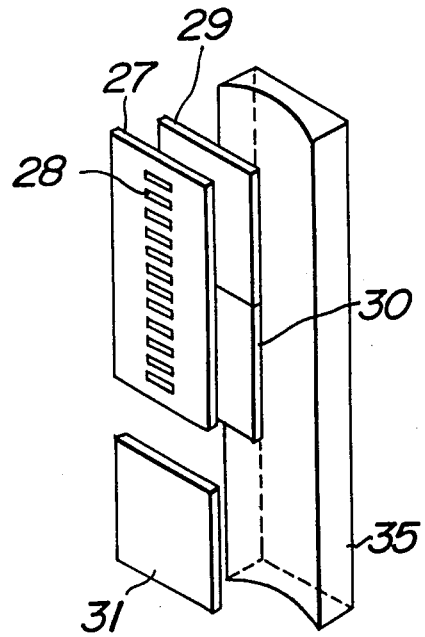

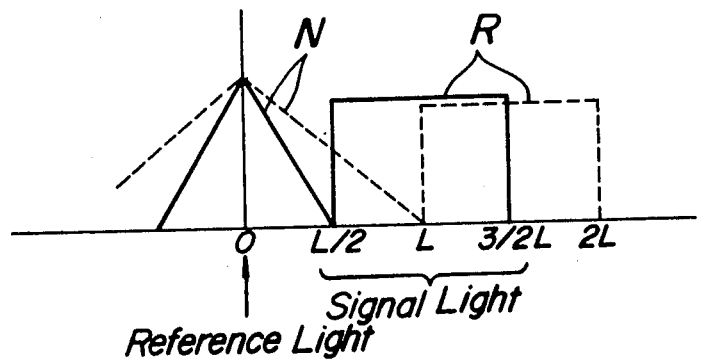
FIG_6
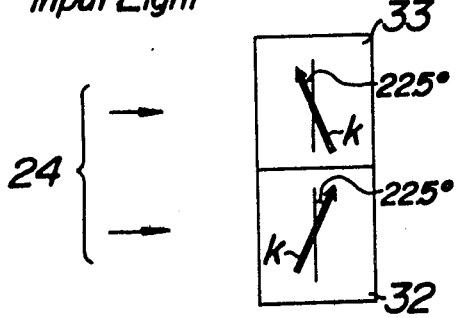
FIG_7a  FIG_7b
Input Light
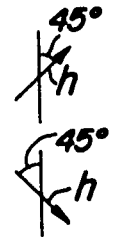
FIG_7c
Output Light
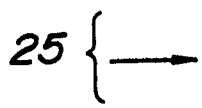
FIG_12
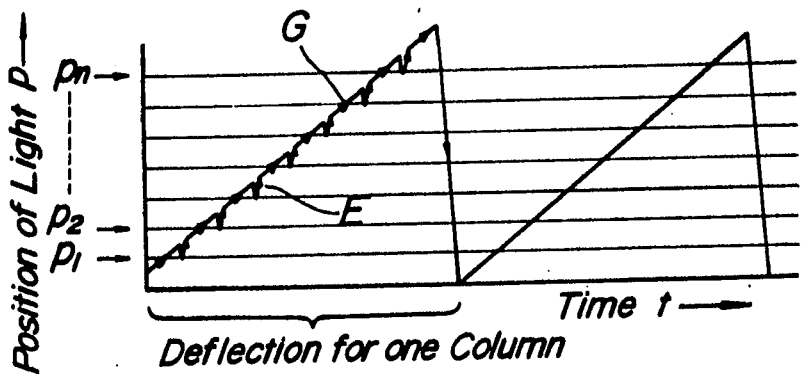

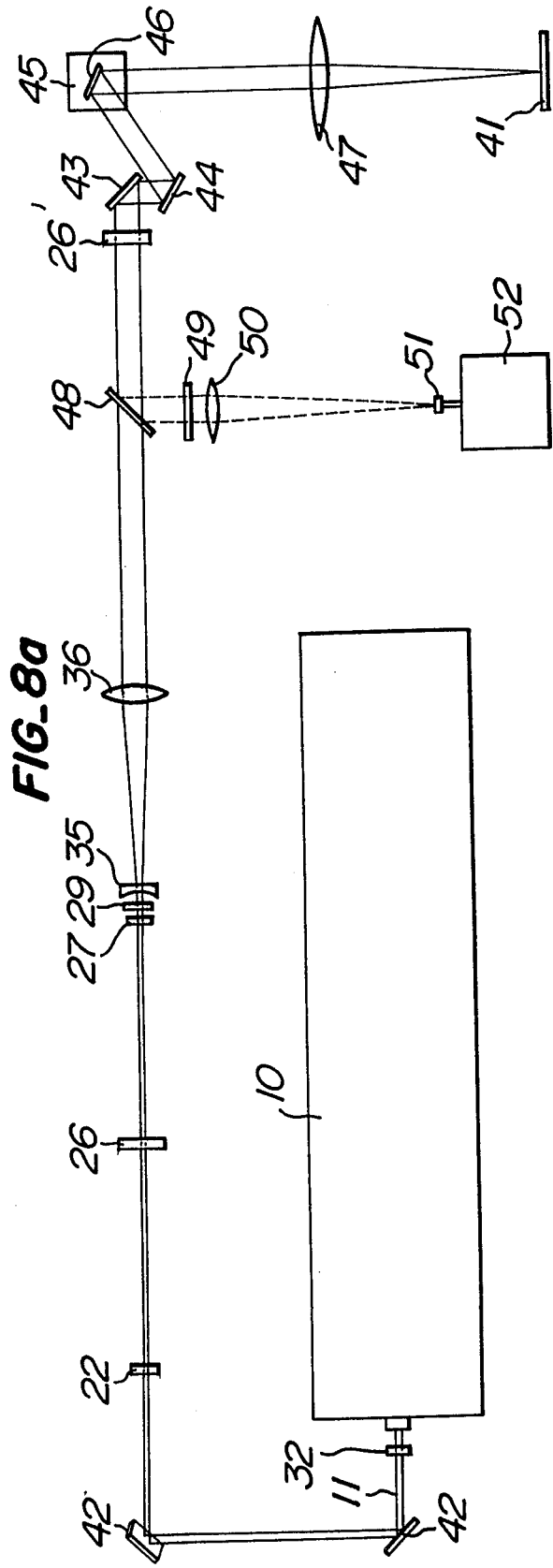
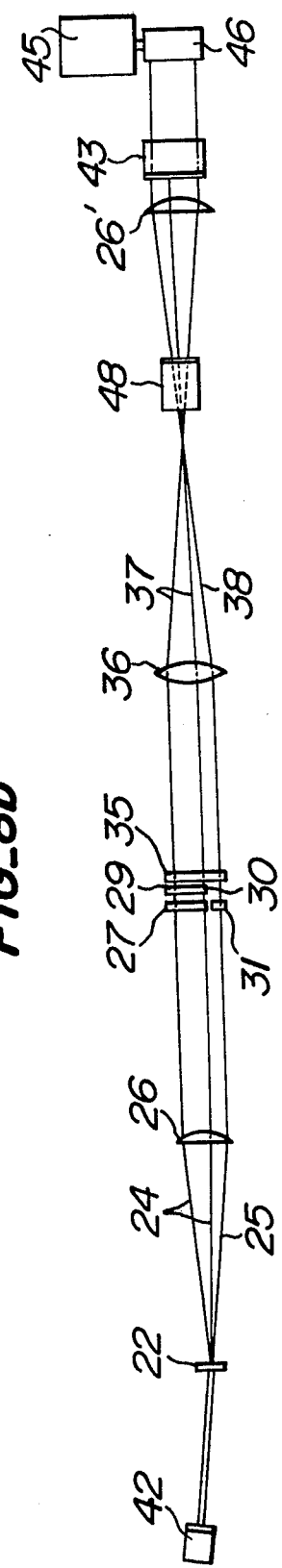
FIG_8a
FIG_8b

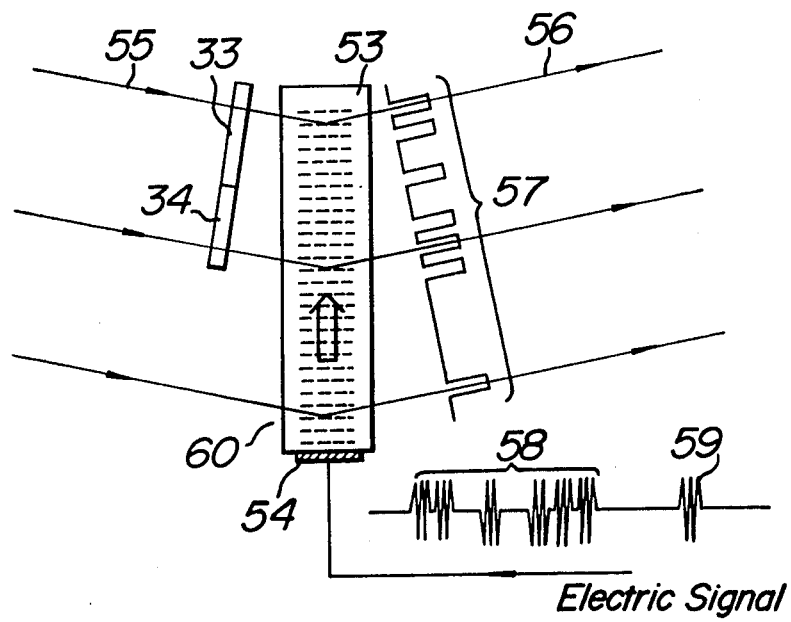
FIG._9
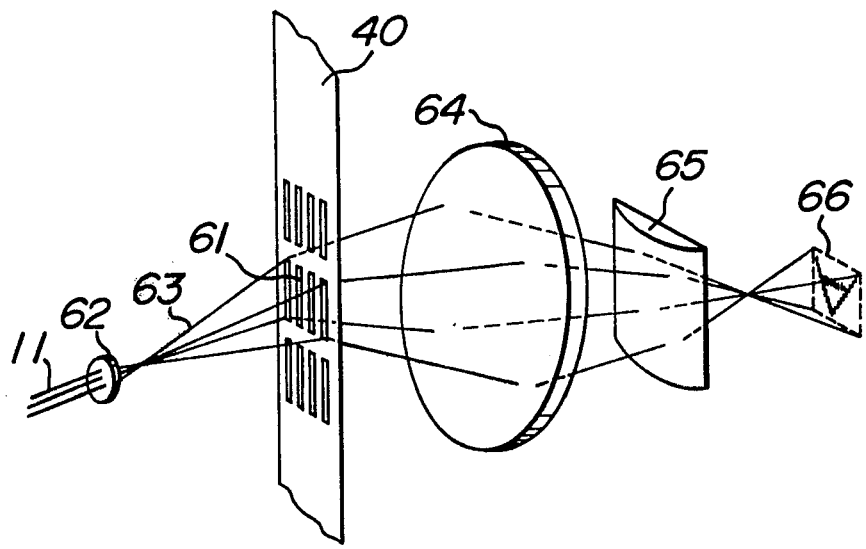
FIG._10

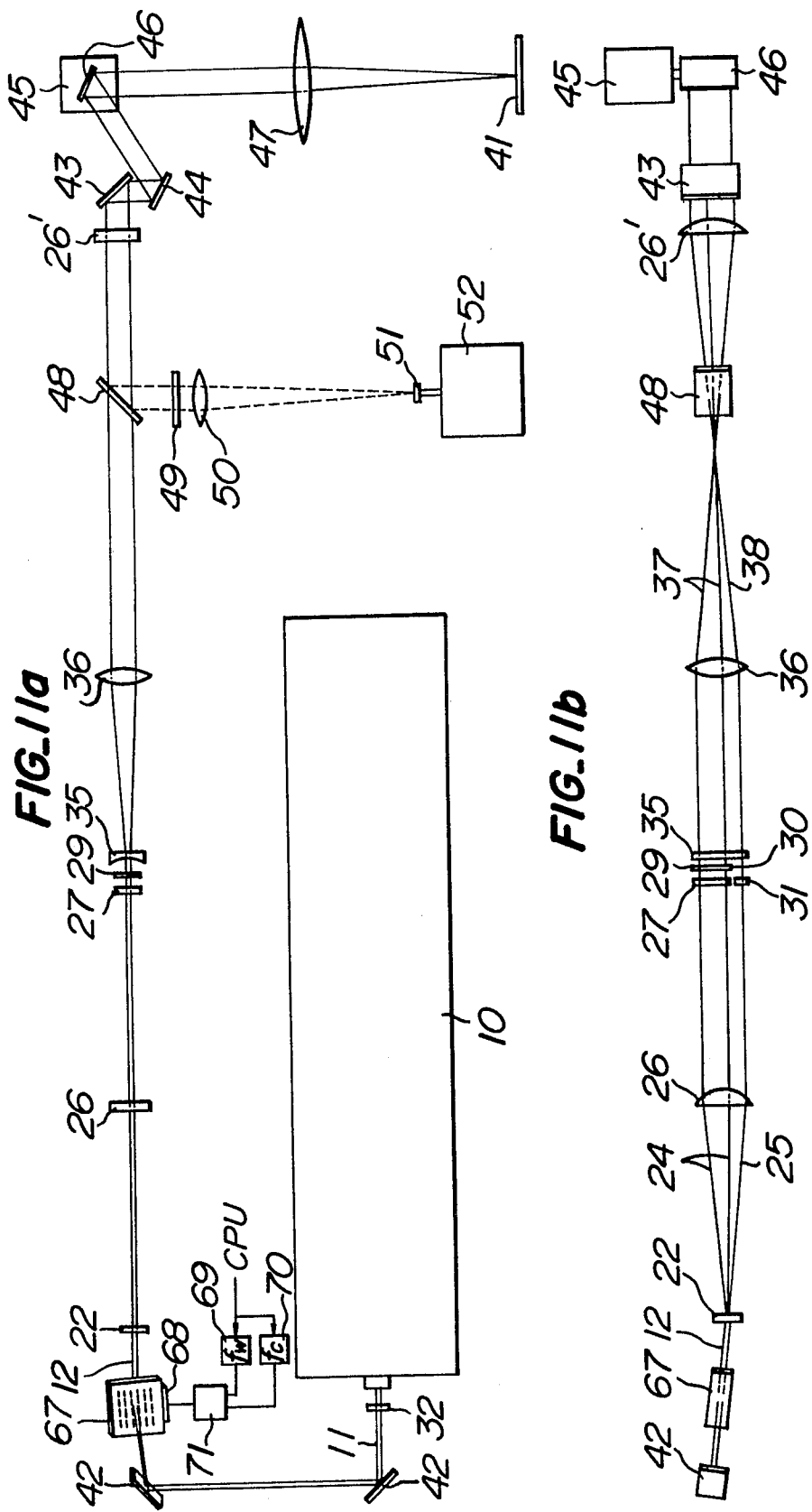

HOLOGRAM MEMORY APPARATUS

BACKGROUND OF THE INVENTION

1. Field of the Invention

The present invention relates to a hologram memory apparatus for recording and reconstructing spatial pattern information. More precisely, the present invention relates to an improvement of such an apparatus of which the structure is greatly simplified by using the one-dimensional hologram recording.

2. Description of the Prior Art

As a conventional method and apparatus for recording information in a one-dimensional hologram, it is known to use a computer-generated hologram, in which an input information is Fourier transformed by means of a computer to produce an electric holographic signal and an electron beam or a laser beam is modulated by the electric signal and is used for recording. For instance, Adam Kozma et al had submitted a report in the 1971 IEEE/OSA Conference on Laser Engineering and Applications (Session No. 152). This suggested system has an advantage in that a spatial modulator is not required; however, it contains a disadvantage in that the writing speed cannot be made high enough owing to a long computation time.

There are various disclosures with respect to the two-dimensional page-oriented hologram memory. This kind of apparatus, however, had encountered a number of technical difficulties mainly due to the complicated construction of the structural devices since it requires various elements such as a two-dimensional spatial modulator, i.e. page composer or a two-dimensional photo detector matrix, etc.

Furthermore, there had been an attempt to realize a simplified hologram memory system considering applications as wideband recorders. For instance, Andrew Bardos disclosed such a system in Applied Optics, Vol. 13, No. 4, April 1974, pp. 832–840. In this system, a time series of a given electrical pulse information is rearranged into multi-channel information and by using such multi-channel information the respective channel of a multi-channel acousto-optic light deflector is controlled as a spatial modulator and thus the input signal light beam is formed. The input signal light beam is subjected with a doppler shift. Accordingly, in the recording of the hologram in order to stabilize the interference fringe, the reference light should also be subjected with such a doppler shift to the same extent with the signal light by using another acousto-optic light deflector, names an acoustic beam splitter, to give diffractive deflection for the laser beam. Accordingly, the optical path for the reference light beam is separated from that of the signal light path at the acoustic beam splitter and thus the strip-shaped hologram recording is made through a writing lens after readjustment of the signal light beam and the reference light beam to be parallel with each other. There exist two problems in this step. One is the stability of the system due to use of a separate optical path. Another is the demand for large aperture lens systems, which make them costly and difficult to produce.

SUMMARY OF THE INVENTION

The present invention has for its object to mitigate the technical difficulties of the structural complications of the elements of such known halogram memories and to realize a novel hologram memory apparatus based on a principle of one-dimensional hologram recording. In the one-dimensional hologram memory apparatus, a one-dimensional spatial modulator, i.e., linear page composer, displays the information as a one-dimensional spatial pattern and the information is recorded in the form of a one-dimensional hologram and is read by a one-dimensional photo detector array. In the hologram memory apparatus according to the present invention using a one-dimensional hologram in order to make the signal light and the reference light to automatically coincide with each other, the apparatus is formed in a manner that the light beams are directed from a laser source to a recording material by means of a common optical system having a common light axis for the signal light and for the reference light. At reconstruction of the information recorded as hologram, the signal light generally produces an auto-correlation image besides the signal information on the reconstructed image plane. The auto-correlation image causes a spread of the light as a noise. Accordingly, the reference light must be placed at a location spread from the signal light a distance greater than the length of the page composer in order to avoid such overlapping of the signal with this noise component. In the conventional system such a separate arrangement had been a usual practice. With such system, if a common optical system is to be realized, the aperture of the lens necessarily becomes larger.

In accordance with the present invention, the incident signal light is divided into two portions by means of a combination of two polarizers having two portions each of which varies the plane of polarization of the incident linearly polarized light beam by a certain angle. By this means the incident signal light is altered into a linearly polarized light having two planes of polarization crossing orthogonally with each other. Thus the spread of the auto-correlation image can be decreased to one half according to the principle that two linearly polarized light beams having orthogonally crossing planes of polarization do not interfere with each other. By this means the spread of noise can be decreased to one half the amount and thus the reference light beam may be placed nearer to the signal light beam by this amount. In practice if we assume the total width of the signal light to be L, the reference light may be placed at a location spaced 1/2L therefrom. In the present specification, such a combination of two polarizers or a combination of two half wave plates having the equivalent function of the polarizers may be termed as a polarization controlling device.

The present invention realizes the construction of the apparatus using an optical system of which the signal and the reference light have a common optical axis from the light source and to the recording medium by using such a polarization controlling device.

The apparatus according to the present invention for recording information as one-dimensional holograms comprises;

a. an optical source means producing a coherent light beam, b. a beam splitter means for dividing the coherent light beam into a signal light beam and a reference light beam, c. a write-in optics having a common optical axis for the signal light beam and for the reference light beam, and for spatially dividing the signal light beam into two portions of light beams having orthogonally crossing planes of polarization including a polarization controlling device, which spatially divides the signal light beam into two portions of light having orthogonal polarizations, for enabling the position of the optical path of the reference light beam at a closer location by L/2 with the optical path of the signal light beam, wherein the full length of the signal light beam is L, d. a reading out optics and apparatus for read-out the recorded information by irradiating the hologram including a one-dimensional photo-detector array, an optical lens system and a read-out circuit, and e. a memory medium driving means and a memory medium for recording the one-dimensional spatial pattern as a hologram.

The first object of the present invention is to realize a hologram memory apparatus having a simplified structure and mitigating technical disadvantages of the conventional hologram memory apparatus.

The second object of the present invention is to realize a hologram memory apparatus for displaying the information as one-dimensional spatial pattern and recording as a very sharp strip shaped one-dimensional hologram having width in counter proportion to the width of the light beam.

The third object of the present invention is to realize a hologram memory apparatus having an information write-in optics which comprises a common optical axis for the signal light beam and for the reference light beam.

The fourth object of the present invention is to provide a hologram memory apparatus being able to record either an analog information or a digital information by an identical single apparatus.

The fifth object of the present invention is to obtain a hologram memory apparatus having high reliability by introducing the structural elements having the operational function for error check.

BRIEF DESCRIPTION OF THE DRAWINGS

FIG. 1 is a perspective view for showing the basic principle of the hologram memory apparatus, FIG. 2 is a top view of FIG. 1, FIG. 3 is a side view of FIG. 1, FIG. 4 is a more practical perspective view for showing the spatial relation between the polarization controlling device or polarizer, a light switch array, a half wave length plate and a cylindrical concave lens, FIGS. 5a, 5b and 5c show diagrams for explaining the variation of plane of polarization of the laser light beam by the polarization controlling device, using a form of electric vector, FIG. 6 is an explanatory diagram for showing the effect of introduction of the polarization controlling device, FIGS. 7a, 7b and 7c show diagrams for explaining the variation of the electric vector of the laser light beam according to a modified embodiment of the polarization controlling device including a half wave plate, FIGS. 8a and 8b are explanatory views for showing one embodiment of the one-dimensional hologram memory apparatus, according to the present invention, FIG. 9 is an explanatory diagram of an embodiment employing an acousto-optic light deflector as the one-dimensional spatial modulator, FIG. 10 is a perspective view for showing the a optical system for reconstructing optical image by irradiating a hologram array recording information for one optical image, FIGS. 11a and 11b are explanatory diagrams of an embodiment of a one-dimensional hologram memory apparatus having an error check facility, and FIG. 12 is an explanatory diagram of an instantaneous reverse deflection operation of the acousto-optic light deflector used for error check.

DESCRIPTION OF THE PREFERRED EMBODIMENTS

The invention will now be described in greater detail with reference to the several preferred embodiments shown in the drawings.

FIG. 1 shows a perspective view illustrating the principle of the hologram memory apparatus according to the present invention. FIGS. 2 ad 3 show a top view and a side view of FIG. 1, respectively. In order to simplify the description, there is shown a recording optical system having a common optical system the optical axis of which coincides with the axes of a signal light beam and a reference light beam. Reference numeral 20 designates a laser light beam emitted from a laser light source, not shown, which produces a coherent light. The laser light source may produce the light pulses so as to cause an intermittent exposure, or it may produce the light continuously and then the beam is pulse-modulated in the apparatus.

Reference numeral 21 designates a holographic beam splitter which receives the laser beam 20 and produces beams 23 in consequence of a diffraction of the incident laser beam 20 and a transmitted light beam 25.

The holographic beam splitter 21 is a kind of hologram in which beams corresponding to the diffracted laser beams 23 and the transmitted laser beam 25 are recorded as a signal light beam and a reference light beam, respectively. The beams 23 correspond to a reconstructed wave from the hologram.

Numeral 26 is a cylindrical lens which focusing the laser beams 23 into parallel beams which is then guided to a one-dimensional light switch array or linear page composer 27. As the light switch array, various kinds have been proposed in which, for example, liquid crystals or crystals having an electro-optic effect are used.

Numerals 29 and 30 are polarizers arranged such that the directions of the plane of polarization expressed by the electric vectors of light transmitted therethrough intersect with each other orthogonally. Those polarizes are referred as polarization controlling devices hereinafter. Numeral 31 is a half wave plate to direct an electric vector of the laser beam 25 in a pre-determined direction.

Numeral 35 is a cylindrical concave lens which diverges the laser beam transmitted through the one-dimensional light switch array 27, the polarizers 29, 30 and the half wave plate 31 toward one direction. A spherical lens 36 is disposed such that a focal plane thereof coincides with a front focal plane of the cylindrical concave lens 35, and transforms the beams diverged toward one direction into ribbon-shaped flat beams 37 (signal beams) and 38 (reference beam). The cylindrical concave lens 35 may be replaced with a cylindrical convex lens disposed at a front side of the light switch array 27 such that the light switch array 27 is situated at a back focal plane of the cylindrical convex lens so as to effect a similar magnification of the width of the beams. However, in such a case, a strong concentration of the laser beam is caused, so that there arise difficulties due to the influences of inhomogeneity of the material of the light switch array or reduction of transmittance dependent of a light beam incidence angle according to the material.

The signal light beams 37 and the reference light beam 38 are converged by the spherical lens 36 and the cylindrical lens 39 on a memory medium or a recording material 40, such as a high resolution photographic film, located at the back focal planes of both of the lenses, and a hologram series in the form of a linear array of data points is formed on the running film 40 by effecting an intermittent exposure. The hologram is a strip-shaped hologram having a width which is counter proportional to the width of the input flat beam. In the construction explained above, the transmitted light beam of the light switch array and the reference light beam are transformed into flat beams by the combination of the cylindrical concave lens and the spherical lens both of them being disposed at the back side of the light switch array. Therefore, the diameter of the laser beam transmitted through the light switch array 27 can be made small, and the opening width of the light switches can also be made small. For these reasons, manufacture of the light switch array is simplified. It is, of course, readily understood that a similar effect may be obtained by previously widening the opening of the light switches. Further, in the above explanation, the holographic beam splitter 21 produces the beams 23 as separate beams. Instead, the holographic beam splitter 21 may produce a light flux having such an expanse that the whole area of the light switch array is exposed. In this case also, a similar effect may be obtained since the light flux, after being transmitted through the light switch array 27, is divided into a number of smaller light beams by the light switch array 27.

In FIG. 4, there is shown in an enlarged scale a relative disposition of the light switch array 27 having an overall length of L, the polarizers 29, 30 each having an overall length of 1/2 L, the half wave plate 31 and the cylindrical concave lens 35.

The light switch array 27 is disposed in the neighbourhood of the focal plane of the cylindrical concave lens 35. Numeral 28 designates a light switch.

The light switch array 27 controls the orientation of the plane of the polarization which is expressed by an electric vector of the input laser beam, and is ON for a "1" bit and OFF for a "0" bit by combining with the polarizer. As for the material of such a light switch, there are known transparent ferro-electric ceramics, Lithium niobate (LiNbO$_3$) single crystal and so on having an electro-optic effect. As for transparent ferro-electric ceramics, PLZT transparent ceramics is well known in which solid solution of Lead titanate and Lead zirconate is doped with a few percent of Lanthanum.

In the case an electro-optic crystal is used as the light switch array, the magnitude of birefrigence of the electro-optic crystal constituting the light switch array may be controlled electrically. By such a control, rotation of the electric vector of the laser beam transmitted through the light switches is controlled. The polarizers 29, 30 transmit or intercept the light beam in accordance with the orientation of the electric vector of the light beam transmitted through the light switch, and switch the laser beam on and off so as to display the one-dimensional bit pattern.

FIGS. 5a to 5c show the transformation of the electric vectors of the laser beam at the front side and the back side of the light switch array. FIG. 5a indicates the orientation of the electric vector of the input light beam into the light switch aray, 5b indicates the orientation of the polarizers 29, 30 and the half wave plate 31, and FIG. 5c indicates the orientation of the electric vector of the output light beam. In these figures, the references h, i, k designate the orientation of the electric vector, the required orientation of the electric vector for permitting the light transmission through the polarizers, and the optic axis of the half wave plate, respectively.

The light switch illuminating beams 23 and the reference laser beam 25 enter into the light switch array 27 and the half wave plate 31 respectively at an incident angle of 45° against the optic axis of the light switch. The light switches at an upper half of the light switch array, when ON for a "1" bit, are not supplied with voltage, and transmit the incident laser beam without rotating its electric vector. The orientation of the polarizer 29 is such that the "1" bit light is transmitted.

The light switches at the lower half of the light switch array, when ON for a "1" bit, are supplied with a constant voltage so as to control the birefrigence of the electro-optic crystal and rotate the orientation of the electric vector of the laser beam by 90°. The plane of polarization of polarizer 30 intersects orthogonally with that of the polarizer 29 and passes the transmitted light through the lower half of the light switches, the electric vector of which being rotated by 90°, so as to transmit "1" bit. When the switches are OFF for a OFF "0" bit, the light switches in the upper half are supplied with a voltage and the light switches in the lower half are not supplied with a voltage. Then, the electric vector of the transmitted light through a light switch intersects orthogonally and is intercepted by the polarizers 29 or 30, so that the "0" bit is not transmitted.

Since the orientation of the electric vector of the polarized light applied at the upper half of the light switch array is previously adjusted to orthogonally intersect with the lower half, the output light from the upper half of the light switch array possesses an electric vector intersecting orthogonally with the electric vector of the output light transmitted through the lower half of the light switch array. It is readily understood that in such an embodiment there will be no interference between light transmitted by the two halves.

As it is necessary to form a hologram by interference of the reference light beam with either one of two electric vectors of the signal light beam intersecting orthogonally with each other, the optic axis of the half wave plate 31 is adjusted such that the electric vectors of the reference light beam intersect with the electric vector of the signal light beams by 45°.

As mentioned above, by the voltage control of the light switches and the usage of two polarizers, the signal light beam is divided into upper half beams and lower half beams both having electric vectors intersecting orthogonally with each other. Such a disposition is employed in order to decrease the spread of the auto-correlation image of the one-dimensional bit pattern generated around the directly transmitted laser beam of the hologram to one half the amount or 1/2 L upon reconstruction for read-out.

FIG. 6 illustrates that the spread of the auto-correlation image is decreased to one half the amount when the polarization controlling device according to the invention is employed.

As an auto-correlation image is considered to be a noise for the reconstructed image of the hologram, it is already known to space apart the signal light beams and the reference light beam at a sufficient distance greater than L to eliminate such an influence, such that the spread N (noise) of the auto-correlation image does not overlap with the reconstructed image R. If the signal light beams and the reference light beam are transmitted through a common optical system, and the distance between the signal light beams and the reference light beam is wide, the aperture of the optical system becomes inevitably large which is disadvantageous. Accordingly, in the present invention, the polarization controlling device is provided as explained above, in order to decrease the auto-correlation image to one half the amount, and to reduce the distance between the signal light beams and the reference light beam to greater than 1/2 L, so that a reduction of the load of the optical system is effected. In FIG. 6, the full line shows the spread or noise N of the auto-correlation image as well as the reconstructed image R when the polarization controlling device is employed, and the broken line shows the spread N and the image R when such a device is not employed. To be definite, assuming that the total width of the signal light beam to be L, the spread of the auto-correlation image from the center of the directly transmitted light beam becomes L, and accordingly, it is necessary to space the reference light beam the distance slightly greater than L apart from the signal light beams. Therefore, the aperture of the lens should be at least 2L when the signal light beams and the reference light beam are transmitted through a common optical system. When the signal light beams are divided into two orthogonally intersecting portions at equal length of L/2, by the reason that linear polarizations intersecting orthogonally do not interfere with each other, the auto-correlation image of the signal light beams may be decreased to one half the amount. Therefore, the reference light beam may be placed closer at a location spaced slightly greater than 1/2L from the signal light beams, and hence the aperture of the lens can be decreased to about 3/2L. This shows that if a lens having 100 mm aperture was required by the known apparatus, according to the present invention, a lens having 75 mm aperture is enough and the optical system design will be greatly simplified.

FIGS. 7a to 7c show transformation of electric vectors of laser beams in another embodiment of the polarization controlling device composed of half wave plates.

In this embodiment, light switch array 27 may be of the type based on a different principle from that explained in FIGS. 5a to 5c, in which birefrigence of an electro-optic crystal is controlled by an electric field. As such a light switch array, an acousto-optic light deflector which will be explained by referring to FIG. 9 may be used. In this case, the signal light beam may spatially be divided into two portions of light beams the electric vectors of which intersect orthogonally by means of a polarization controlling device composed of half wave plates shown in FIG. 7b. Numerals 32, 33 are half wave plates the optic axes thereof being different from each other, for spatially dividing the signal light beam into two portions of light beams having orthogonally crossing electric vectors, so as to attain the same effect as in the embodiment of FIG. 5.

As shown in FIGS. 7a to 7c, the signal light beam 24 is spatially divided into two portions of beams having orthogonally crossing electric vectors h. Reference k indicates optic axes of the half wave plates.

In this embodiment, the half wave plate 31 shown in FIG. 5 is not necessary.

It is apparent, by those knowledgable about holography, that the read-out of the information can be carried out, though not shown here, by using the reference beams as a reconstruction beam by which the hologram is exposed, and thus the pattern displayed by the spatial modulator is reconstructed. Therefore, when a one-dimensional photo detector array is disposed at the position, where the pattern is reconstructed, so as to receive the information and transform into an electric signal, the information is readout.

FIGS. 8a and 8b show an embodiment of one-dimensional hologram memory apparatus according to the present invention in a more practical form. FIG. 8a is a side view, and FIG. 8b is a partial plan view of the apparatus.

Reference numerals 10 and 11 are a laser light beam source and a laser light beam. A laser light beam source of the known kind made by Spectra Physics may be used. Numerals 42, 43, 44 are mirrors for changing the optical path, and 32 is a half wave plate controlling the orientation of the electric vector of the laser light beam. Numeral 22 is a holographic beam splitter, and 24 are light beams for illuminating a light switch array 27, which are diffracted light of the polarized light 11 by the holographic beam splitter 22. In this embodiment, the beam splitter 22 is formed such that a uniform cylindrical wave is obtained as the diffracted light; however, the diffracted light may be the beams of the number of the light switches as explained with respect to the embodiment shown in FIG. 1. Numeral 25 is the directly transmitted light of the polarized light against the holographic beam splitter 22 serving as a reference light beam. Numeral 26 is a cylindrical lens focusing laser beams 24 and 25 into parallel beams. 27 is a light switch array, 29, 30 are polarizers, 31 is a half wave plate, and 35 is a cylindrical concave lens which are already shown in FIG. 4. 36 is a spherical lens, and 37 and 38 are signal light beams and reference light beams corresponding to those shown in FIG. 1, respectively.

The signal light beams 37 and the reference light beam 38 are caused to pass through the cylindrical lens 26' and mirrors 43 and 44 onto a rotating mirror 46 of a galvanometer 45, so that scanning is performed. Then, the beams are focused by a light focusing lens (spherical lens) 47 to form a strip-shaped hologram on a recording film located at the focal plane of the lens 47. Due to the scanning by the rotating mirror 46 and the intermittent exposure of the laser light beam, the strip-shaped holograms are successively formed in series extending in the width direction of the recording film 41. When the film 41 is continuously driven in a direction perpendicular to the plane of drawing of FIG. 8a, or when it is intermittently moved by a pre-determined length as a column of the holograms are formed, a hologram matrix is formed by repeated scanning of the rotating mirror 46.

As for the disposition of each of the optical elements, the holographic beam splitter 22 and the light switch array 27 are placed at the front and the back focal planes, respectively, and the light switch array 27 is further placed at each front focal planes of the cylindrical concave lens 35 and the spherical lens 36. The back focal plane of the spherical lens 36 and the front focal plane of the cylindrical lens 26 disposed at the back side of the lens 35 coincide together. The rotating mirror 46 of the galvanometer 45 is located in the neighborhood of the back focal plane of the cylindrical lens 26' and the front focal plane of the light focusing lens 47. The recording film 41 is located at the focal plane of the light focusing lens 47.

When the recorded hologram is illuminated by the reference light beam 38, the reconstructed image is obtained as diffracted light by reflection which then reaches a half mirror 48 through the optical system used to form the hologram inversely, and is reflected downwardly as shown in FIG. 8a. The reconstructed image is formed by a image-forming lens 50 on a photo detector array 51, and then, is readout. Each of the elements of the photo detector array are linearly disposed in a direction perpendicular to the plane of FIG. 8a. Numeral 52 is a readout circuit which amplifies the recorded informations transformed into an electric signal by the photo detector array 51 to reform the shape of the waves.

A polarizer 49 is directed in accordance with the orientation of electric vector of the reference light beam such that the maximum transmittance of the reference light beams is effected and that the signal light beam leaking through the closed light switch array is damped enough to decrease the influence of the leakage of the light switch array overlapping with the reconstructed bit image.

The photo detector may be of the known type, such as photo diode or photo transistor. The readout circuit may also be of the known type such as shown in RCA REVIEW, vol. 34, No. 1, p. 44, FIG. 22, by W. C. Stewart et al. Therefore, detailed explanation will not be necessary.

In the case of obtaining the reconstructed image as transmitted diffraction light, which especially corresponds to the case in which a photographic film as a recording film is used, the optical system for read-out can be realized, according to the general knowledge of holography, by disposing the polarizer 49, the image forming lens 50, the photo detector array 51 and the readout circuit 52 at the back side of the recording film 41, respectively. In such a case, the half mirror 48 is not necessary.

It is readily understood that a rotating poligonal mirror may be used instead of the galvanometer light deflector 45.

The principle of the light switch array in the embodiment shown in FIG. 8 is to rotate the orientation of the electric vector of the incident laser beam. However, the function of the light switch array is also performed by an acousto-optic light deflector. In FIG. 9, there is shown an acousto-optic light deflector 62, which may replace with the light switch array 27 of the embodiment shown in FIG. 8, and the method will now be explained in which the hologram recorded information is displayed by using the acousto-optic light deflector.

In a transparent ultransonic vibration propagating medium 53, a pulse modulated high frequency electric signal through a transducer 54 energizes an ultrasonic wave. This means that in a moment there exists an ultrasonic wave modulated according to the electric signal along the propagating medium 53. A laser light beam 55 is caused to impinge onto the medium 53, and the beam 55 is diffracted by the ultrasonic wave. At this moment, since the ultrasonic wave is being amplitude modulated by the electric signal, the diffracted light 56 is light intensity modulated spatially as shown by the pulse wave 57, to display the optical display of the electric signal. As the ultrasonic wave propagates at a given high speed in the medium 53, as shown by a large arrow indicated in the medium 53, the optical display of the electric signal is done instantaneously, and therefore, instantaneous exposure is required in order to record it into a hologram.

In the embodiment shown in FIG. 9, a laser device generating a pulsed light beam is used as a light source 1. Instead thereof, an additional light modulator of the known kind, not shown in FIGS. 8a and 8b, may be disposed between the reflecting mirror 42 and the hologram beam splitter 22 as a high speed light switch so as to effect the instantaneous exposure of the laser beam. In the apparatus according to the present invention, special attention is required in supplying an input electric signal in order to establish an effective display of the information to be recorded by the ultrasonic light deflector as shown in FIG. 9. In the present invention, the input electric signal is composed of a pulse series 58 representing bit informations to be recorded into hologram, and an isolated pulse 59 which appears at a position spaced a given distance from the pulse series 58 on the time axis. By such an arrangement, the signal light beam and the reference light beam are obtained simultaneously from the pulse series 58 and the isolated pulse 59, respectively. Thus, the signal light beam and the reference light beam are obtained by the common ultransonic light deflector. The reason for the above arrangement is to eliminate the influence of the transverse parallel movement of the ultrasonic wave displaying the information to be recorded across the optical system during the exposure period. When the electric signal generating the signal light beams and the reference light beam is transformed into the identical propagating ultrasonic wave, the distance between the signal light beams and the reference light beam may be kept constant during the exposure period even though the ultrasonic wave propgates, and as a result, clear interference fringes can be recorded on the recording medium. If the distance between the signal light beams and the reference light beam, transformed into the angle between those two beams when they are focused on the recording medium, varies during the exposure period, the pitch of the interference fringes varies accordingly. Therefore, in such a case, clear recording of the interference fringes cannot be effected, and the diffraction efficiency of the constructed hologram becomes extremely low.

By the control of a central processing unit (C.P.U.), not shown, which will be explained later, the information to be recorded into a hologram is supplied to the ultrasonic light deflector 60 as an electric signal, and as explained in FIG. 9, the information is then spatially modulated as a diffracted light, which produces the signal light beams and the reference light beam.

The hologram formation, which takes place later on, is carried out in the same manner as in the embodiment of FIG. 8.

The ultrasonic light deflector, used here, per se, is not a novel device. For example, this may be of the type which is manufactured and sold Data Light Inc. Therefore, any further description will not be necessary.

When the pulse series 58 is replaced with a scanning line signal of image information for television video signal, etc., the image information is recorded as a hologram series by recording each image information of the scanning lines successively into strip-shaped hologram. This means that the apparatus according to the present invention can also be used as an image information memory.

For example, by means of a pick-up tube or a image scanner by laser beams, the scanning line signal may be taken out of the image. This scanning line signal represents a shade distribution of the image. The image is divided into a plurality of scanning lines according to a required resolving power, and the shade distribution is transformed into the intensity of the electric signal. The electric scanning line signal, in the embodiment of FIG. 9, is supplied to the ultrasonic light deflector 60 together with the reference light pulse 59, and recorded as a strip-shaped hologram. The shade distribution on the scanning line is transformed into electric signals, and then is successively supplied to the ultrasonic light deflector. Thus, one image may be recorded as a strip-shaped hologram series the number of which is equal to that of the scanning lines.

In the embodiment shown in FIG. 9, the signal light beam has been divided into two components, having orthogonally crossing electric vectors by means of half wave plates 32, 33 explained by FIG. 7, so that the disturbance by the auto-correlation image of the recorded image when obtaining the reconstructed image can be reduced. In the case of analog signals, it is considered that the influence of the auto-correlation image is not so great as for digital signals. Therefore, in some cases, the hologram formation may be performed without using the half wave plates. In FIG. 9, the half wave plates 32, 33 were explained to be located at the front side of the ultrasonic light deflector; however, those half wave plates 32, 33 may also be located at a suitable back side position of the ultrasonic light deflector.

As for the method of reconstruction of the picture image divided and recorded into a hologram series, the picture image can be reconstructed by each scanning line by reading each hologram, as shown in FIG. 8. However, another method can be employed in which a hologram series of one image information is simultaneously reconstructed by means of an optical system shown in FIG. 10.

As shown in FIG. 10, strip-shaped hologram array is recorded on a photographic film 40 toward its width direction. Numeral 61 designates a hologram series by which one image information is recorded. The laser beam 11 is transformed into a spherical wave 63 by an object lens 62. The spherical wave 63 illuminates the hologram series 61 to effect the image reconstruction. Both of the focal lengths of a spherical lens 64 and a cylindrical lens 65 are adjusted to f. The distance between the diverging center of the spherical wave and the spherical lens 64 is adjusted to 2f. Further, both of the distance between the photographic film 40 and the spherical lens 64 and the distance between the spherical lens 64 and the cylindrical lens 65 are adjusted to f. In this case, the photographic film 40 toward its width direction is in image forming relation with the back focal plane of the cylindrical lens 65, by means of the spherical lens 64 and the cylindrical lens 65. And the reconstructed images of the shade distribution on the scanning line generated by each hologram are separated from each other, forming images on the back focal plane of the cylindrical lens 65, to give the reconstructed image of one image information.

If a semi-conductor laser device is directly disposed at the diverging center of the spherical wave 63, the toatal reconstruction apparatus can be made small. In general, degree of coherence, i.e., uniformity of light wave of the semi-conducter laser light is high in one direction; however, in the direction perpendicular to said direction, these parameters are low. Therefore, in the reconstruction system shown in FIG. 10, the semiconductor laser device is disposed such that the direction, in which the degree of coherence is low, extends toward the width direction of the photographic film 40, or toward the hologram series. By this arrangement, there exists an image forming relationship independent from the degree of coherence, and hence the semi-conductor laser device can be employed.

As explained above, the acousto-optic light deflector can display not only digital signals, but also analog signals, and it can be used as not only a light switch array, but also as a general one-dimensional spatial modulator. Moreover, the effective way to utilize the acousto-optic light deflector in the apparatus according to the present invention has been disclosed.

When the acousto-optic light deflector is used as one-dimensional spatial modulator of the apparatus according to the invention, image information suited for human visual information processing and digital code informations suited for processing by machinery, such as an electronic computer, are recorded together on the identical recording medium by a common recording apparatus. If digital codes for retrieving purpose are recorded together with the image information to form a image information file, extremely high efficiency in retrieval of the image information can be carried out.

FIGS. 11a and 11b are views explaining an embodiment of a one-dimensional hologram memory apparatus according to the invention, having an error checking function.

In the embodiment shown in FIGS. 11a and 11b, a function of error check is performed. The reconstructed image out of holograms obtained as the reflected image is detected to readout the recorded informations out of the holograms immediately after they have been formed, so that the error check is effected in which is checked whether or not the informations are correctly being recorded. The function of error check will now be described.

Numeral 67 designates an acousto-optic light deflector of a known type, which by means of a transducer 68 transforms electric inputs generated by oscillators 69 or 70 into an ultrasonic wave, and deflects the incident laser light beam on the acousto-optic light deflector 67 by an angle which is proportional to the frequency of the ultrasonic wave. Numeral 12 is a deflected light of the laser light beam 11. Numeral 71 is a power amplifier which supplies driving electric power to the acousto-optic light deflector 67. Each of oscillators 69, 70 are the driving frequency generators, which are controlled in their oscillation by a central processing unit (C.P.U.) not shown explicitly in FIG. 11.

The readout of the hologram for error check is performed only by means of the reference light beam 38 by closing every light switch to intercept the signal light beams 37.

Further, when the acousto-optic light deflector 60 of FIG. 9 is used as a spatial modulator, the light deflector 67 is switched over into the error check deflection position, and at the same time, as the input electric signal for the acousto-optic light deflector 60, only isolated pulses 59 are used for the reference light beams accompanying no pulse series 58, which are the informations to be recorded, so as to generate only the reference light beams, to carry out the error check of the hologram.

Since the rotating mirror 46 is continuously scanning, when the readout for error check is to be initiated after the exposure for hologram formation, the optical path of the reference light beam is spaced from the hologram which has just been formed to move into the formation position of the subsequent hologram. Accordingly, it is necessary to reversely move the optical path instantaneously so as to establish a temporary path for re-illuminating the hologram to be checked. This instantaneous reverse movement of the reference light beam is effected by means of the acousto-optic light deflector 67. In the case of a normal hologram write-in, the acousto-optic light deflector 67 is driven by the oscillator 69 whose frequency is fw to produce the deflected light 12. However, in case of a readout for error check, the driving frequency is switched over from fw into fc, so as to drive the acousto-optic light deflector 67 by the oscillator 70 whose frequency is fc. When the frequency of the ultrasonic wave is switched over from fw onto fc, the laser beam 11 is deflected in the different manner to the normal hologram formation, and a laser light beam for error check is provided whose angle is slightly different to the hologram forming light 12. Compensation for the rotation of mirror 46 by means of reverse deflection is less than $10^{-4}$ radian at the rotating mirror 46, therefore, the difference of the driving frequency to cause such an order of deflection difference is about the order of several mega Hertz. The switching speed of the driving frequency is satisfactorily faster than the rotating speed of the mirror 46, and this switching is performed within one micro second. From the hologram re-illuminated by the reverse deflection, the reconstructed image is obtained as the diffracted image by reflection which is further transmitted through a similar path as such explained in FIG. 8 to be read out.

The recorded information being read out, is immediately supplied to the central processing unit, and is compared with the original information supplied to the light switch array 27 when the hologram is formed. An error defined here includes the case in which the reconstructed bit image detected is different to the original information, and the case in which the reconstructed bit image is not detected because of the low diffraction efficiency of the hologram. It is necessary that the intensity of the laser beam upon readout for error check is restrained low enough such that the hologram already formed may not be destroyed. This restraint is performed by controlling the output of the oscillator 70 so as to adjust the electric power of the light deflector at the frequency fc.

When the readout for error check is finished, the driving oscillator of the light deflector 67 is replaced with the oscillator 69 whose frequency is fw, so that the optical system is returned to its initial position of hologram formation in which the scanning of the signal light beam as well as the reference light beam is effected. At the same time, when an error is detected as a result of the error check readout, the original information is again displayed on the light switch array 27, and if no error is found at this time, the next recorded information is newly displayed on the photo switch array 27. When the error check readingout and the adjustment of the light switch array are finished, as explained above, and the optical path for the signal light beam and the reference light beam is established at the position for forming the subsequent hologram, an instantaneous exposure is carried out and the rewrite-in of the incorrect information or the write-in of the new information is carried out.

Thus, in the embodiment of FIG. 11, the formation of the hologram series can be performed by repeating the hologram formation and the error check alternately.

As shown in FIG. 12, the light deflective scanning in a normmal direction by means of the galvanometer 45 and the mirror 46, and the instantaneous reverse deflective motion for error check by means of the acousto-optic light deflector 67, are combined to alternately repeat the hologram formation and the error check. The abscissa and the ordinate of FIG. 12, respectively represents the time t and the position p of the light flux at the hologram forming plane. References $P_1, P_2, \ldots, P_n$ show n how the positions for write-in of each holograms.

During the deflective movement for one column shown in FIG. 12, the main deflective movement by the galvanometer is performed along an inclined line G. When the write-in at positions $p_1, P_2, \ldots, P_n$ is respectively finished, the error check is performed along line E. Along arrows on line E, the light-flux re-illuminates each recorded hologram for error check repeatedly after the writing-in of the hologram, and thus, the formation of holograms for one column is finished.

In case of obtaining the reconstructed image as transmitted diffraction light, error K check can be realized by the same arrangement for read-out by transmitted diffraction light explained at the embodiment of FIG. 8.

In the embodiment of FIGS. 11a and 11b, the laser beam illuminates the recording film 41 instantaneously and intermittently during the hologram formation and the error check. This intermittent illumination is realized by using a pulsed oscillating laser device as the laser beam source 1, or by actuating the acousto-optic light deflector 67 intermittently by means of high frequency electric power impluses.

As for the recording film 41, a thin film of metals, such as a thin film of Bismuth may be used, in which development and fixation operations required normaly in case of silver salt film are not necessary. Rhodium or Lead may also be used as the metal of the thin film. When the thin film of metal is used, the interference fringes are recorded as a difference of the evaporated value of the thin film of metal according to the different degree of exposure. As satisfactory reflection of the laser light beam is effected by the thin film of metal, the reconstructed image can be obtained not only as the diffracted light be transmission, but also as the diffracted light by reflection of the hologram.

An amorphous semi-conductor including, for example, Arsenic, Tellurium, or Germanium, which is caused a phase transition from non-crystalline state into crystalline state by the illumination of the laser beam, can control the transmissivity and/or the refractive index of light, i.e. the complex refractive index. Therefore, it is used as the recording material of hologram. Further, the crystalline state can be molten by the strong impulsive illumination of the laser beam, and can be returned to its initial non-crystalline state, so that erasing of the recording information and rewrite-in of the new information are possible. Moreover, an amorphous semi-conductor of the kind comprising, for example, Arsenic, Serenium, Sulphur or Germanium, can control the reversible transition between two non-crystalline states, in which the transmissivity and the refractive index differs respectively. As mentioned above, an amorphous semi-conductor is referred to as an example of the rewritable recording material for hologram. Also, magnetic thin film of Manganese bismuth, for example, is known.

Now, a method of controlling will be explained in which the recording of the information, including the normal write-in and rewrite-in, the erasing and the read-out are selectively switched over. This is performed in the same manner as the error check operation mentioned above. Namely, driving frequencies different to each other for the acousto-optic light deflector 67 are switched over so as to deflect the optical path slightly. Three different driving frequencies $f_1, f_2, f_3$ are determined such that against the deflective scanning by the rotating mirror 45, the reverse deflective values of the signal light beam and the reference light beam take greater values in the order of $f_1, f_2$ and $f_3$. At first, the driving frequency $f_1$ is selected in order to read-out the hologram for retrieving the position of hologram to be rewritten. At this moment, it is necessary to lower the driving electric power enough with comparison to the write-in operation such that the recorded hologram is not destroyed. Further, at this moment, the light switch array 27 is closed and the read-out is caused only by the reference light beam which is the same as with the case of error check mentioned above. When the hologram to be rewritten is detected, the driving frequency is switched over to $f_2$ and the reverse deflection is caused toward the passed hologram to be erased, and the erasing is carried out by the strong reference light beam. The driving electric power in this case is high enough for erasure. When the erasing operation is finished, the driving frequency is again switched over into $f_3$ and the further reverse deflection is caused, when a new information displayed on the light switch array 27 is recorded as a hologram and the rewrite-in is finished. If the error check is required, then further reverse deflective frequencies $f_4, f_5$ and $f_6$ are to be determined of which $f_4, f_5$ and $f_6$ are respectively for error check, for erasing and for rewrite-in.

The readout optics are arranged at suitable positions according to the reconstructed image which may be obtained either from the diffracted light by reflection or from the diffracted light by transmission, as mentioned previously.

Thus, the utility of the high speed and slight deflective operation of the laser beam by the acousto-optic light deflector 67 at the error check read-out and the rewrite-in operations is demonstrated. By combining the slight deflection control by means of the acousto-optic light deflector and the wide angle deflective control by means of the rotating mirror, a complicated recording operation in the wide recording domain of the recording medium can be effected with high accuracy and high speed.

The embodiments of the apparatus according to the invention for efficiently forming a high density matrix of strip-shaped holograms with high efficiency has so far been disclosed here. As to the construction of the large capacity hologram memory in the present invention, a large number of holograms may be disposed on a roll film as in the magnetic tape recording apparatus, or a number of films of constant length on which hologram matrices are recorded, which upon read-out may be wound around a rotating cylinder separately. Further, a certain number of hologram matrices may be disposed on a card-like hologram formation basis which will be a hologram recording card. A large number of such cards may be stored and upon read-out, these cards are mechanically taken out into the scanning laser beam one by one, so as to realize a large capacity hologram memory. In case the capacity of the apparatus is small, the recording medium may be disposed on a rotating cylinder or on a rotating disc, such as magnetic drum or magnetic disc, so that much more rapid recording and read-out are made possible.

As explained above in detail, compared to the known hologram memory, in which a two-dimensional spatial modulator and a two-dimensional photo detector are used, the hologram memory apparatus according to the invention comprises a one-dimensional spatial modulator and a one-dimensional photo detector which are much more simple in structure, easy to manufacture and inexpensive. Therefore, even though the recording density remains the same, highly reliable and inexpensive apparatus can be expected in accordance with the present invention.

What is claimed is:

1. A hologram memory apparatus for recording information as one-dimensional holograms, comprising:
   optical source means for producing a coherent light beam;
   beam splitter means for dividing the coherent light beam into at least one signal light beam and a reference light beam;
   first optical means having a common optical axis for said at least one signal light beam and said reference light beam for focusing said light beams into parallel beams, said focused reference light beam being spaced from said focused at least one signal light beam by a distance of slightly greater than L/2;
   light switch means for intercepting said at least one signal light beam and controllably transmitting a plurality of linearly arrayed signal light beams corresponding to information to be recorded, said light switch means having a length L;
   polarization controlling means for spatially dividing said light switch means into two L/2 regions wherein the electric vectors of the contiguous transmitted signal light beams of one region intersect the electric vectors of the contiguous transmitted signal light beams of the other region orthogonally, the electric vector of said reference light beam being at 45° to each of the electric vectors of the transmitted signal light beams from said two regions;
   memory means having a surface in which said one-dimensional holograms are to be recorded; and
   second optical means having a common optical axis for said transmitted signal light beams and said reference light beam for focusing said light beams on the surface of said memory means to form interference patterns, the aperatures of said first and second optical means being on the order of 3/2 L.--

2. A hologram memory apparatus as recited in claim 1 further comprising:
   one-dimensional photo-detector means for generating an electric signal corresponding to an image illuminated thereon; and
   third optical means for focusing on said one-dimensional photo-detector means an image of information reproduced by illuminating one-dimensional holograms recorded on said memory means with said reference light beam.--

3. A hologram memory apparatus as recited in claim 2, wherein said second optical means includes scanning means for continuously deflecting said transmitted signal light beams and said reference light beam in a predetermined direction over said surface of said memory means.

4. A hologram memory apparatus as recited in claim 3, further comprising:
   acousto-optic light deflector means interposed between said optical source means and said beam splitter means for deflecting said coherent light beam as a function of the frequency of an input driving signal; and
   means connected to said acousto-optic light deflector means for switchably supplying driving signals of at least two different frequencies thereby permitting the instantaneous deflection of said reference light beam in a direction opposite to said predetermined direction.

5. A hologram memory apparatus as recited in claim 1, wherein said beam splitter means is a hologram in which light beams corresponding to the diffracted at least one signal light beam and said reference light beam are recorded.

6. A hologram memory apparatus as recited in claim 1, wherein said light switch means comprises a plurality of electro-optic switches in linear array, each of said electrooptic switches being electrically controlled to selectively rotate the electric vector of said at least one signal light beam, the electro-optic switches of said two regions being operated so that light beams from one region have an electric vector which intersects orthogonally with the electric vector of light beams from the other region for similar input information.

7. A hologram memory apparatus as recited in claim 6, wherein said polarization controlling means comprises:
   first and second polarizers respectively arranged to intercept the light beams from the two regions of said switch means and having their directions of the plane of polarization expressed by the electric vectors of light transmitted therethrough intersect with each other orthogonally, one of said polarizers being oriented to pass light beams having their electric vectors rotated by said electro-optic switches and the other of said polarizers being oriented to pass light beams not having their electric vectors rotated by said electro-optic switches, and
   a half wave plate positioned to intercept said reference light beam and having an optic axis oriented to rotate the electric vector of said reference light beam 45° with respect to the electric vectors of light beams transmitted by either of said first and second polarizers.

8. A hologram memory apparatus as recited in claim 1 wherein said light switch means comprises an acousto-optic light deflector means responsive to a pulse series representing information to be recorded.

9. A hologram memory apparatus as recited in claim 8 wherein said polarization controlling means comprises first and second half wave plates respectively arranged to intercept light impinging on the two regions of said switch means and having their optic axis oriented such that the light beams transmitted therethrough have electric vectors which intersect each other orthogonally and at an angle of 45° with the electric vector of said reference light beam.

10. A hologram memory apparatus as recited in claim 1 wherein said surface of said memory means is a medium for recording formed by the vaporization of a thin metal film selected from the group consisting of Bismuth, Rhodium and Lead.

11. A hologram memory apparatus as recited in claim 10, wherein said thin metal film is Bismuth.--

12. A hologram memory apparatus as recited in claim 10, wherein said thin metal film is Rhodium.--

13. A hologram memory apparatus as recited in claim 10, wherein said thin metal film is Lead.--

14. A hologram memory apparatus as recited in claim 1, wherein said surface of said memory means is a medium for recording made of an amorphous chalcogenide film capable of effecting a reversible transition between two states of different complex refractive indexes by the irradiation of a laser beam.

* * * * *